US010263603B2

(12) United States Patent
Urard et al.

(10) Patent No.: US 10,263,603 B2
(45) Date of Patent: Apr. 16, 2019

(54) METHOD FOR MANAGING THE OPERATION OF A SYNCHRONOUS RETENTION FLIP-FLOP CIRCUIT EXHIBITING AN ULTRA-LOW LEAKAGE CURRENT, AND CORRESPONDING CIRCUIT

(71) Applicants: STMicroelectronics SA, Montrouge (FR); STMicroelectronics International N.V., Schiphol (NL)

(72) Inventors: Pascal Urard, Theys (FR); Alok Kumar Tripathi, Ghaziabad (IN)

(73) Assignees: STMicroelectronics SA, Montrouge (FR); STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/462,494

(22) Filed: Mar. 17, 2017

(65) Prior Publication Data

US 2018/0083603 A1    Mar. 22, 2018

(30) Foreign Application Priority Data

Sep. 19, 2016 (FR) ..................... 16 58753

(51) Int. Cl.
*H03K 3/012* (2006.01)
*H03K 3/356* (2006.01)
(Continued)

(52) U.S. Cl.
CPC ....... *H03K 3/356104* (2013.01); *H03K 3/012* (2013.01); *H03K 3/02335* (2013.01); *H03K 3/35625* (2013.01); *H03K 19/0002* (2013.01)

(58) Field of Classification Search
CPC ............. H03K 3/012; H03K 3/356104; H03K 19/0002
(Continued)

(56) References Cited

U.S. PATENT DOCUMENTS 6,437,623 B1 * 8/2002 Hsu .................... G01R 31/319
                                                              327/202
6,597,620 B1    7/2003 McMinn
(Continued)

FOREIGN PATENT DOCUMENTS

WO    WO-2007135487 A1    11/2007

OTHER PUBLICATIONS

INPI Search Report and Written Opinion for FR 1658753 dated May 30, 2017 (8 pages).

*Primary Examiner* — William Hernandez
(74) *Attorney, Agent, or Firm* — Crowe & Dunlevy

(57) ABSTRACT

The synchronous retention flip-flop circuit comprises a first circuit module suitable for being powered by an interruptible power source and a second circuit module suitable for being powered by a permanent power source. The first circuit module includes first and second latch stages, which are configured to store at least one datum while said interruptible power source is supplying power, transmitting means suitable for being controlled by a second control signal and configured to deliver said at least one datum to the second circuit module before an interruption of said interruptible power source, the second circuit module being configured to preserve said at least one datum during said interruption, and restoring means suitable for being controlled by a first control signal and configured to restore said at least one datum at the end of said interruption. Only the second control signal remains active during interruption of the interruptible power source.

14 Claims, 2 Drawing Sheets

(51) Int. Cl.
  *H03K 19/00*    (2006.01)
  *H03K 3/0233*   (2006.01)
  *H03K 3/3562*   (2006.01)

(58) Field of Classification Search
  USPC ....... 327/202, 203, 208, 210, 211, 212, 214, 327/215, 218, 225
  See application file for complete search history.

(56) References Cited

U.S. PATENT DOCUMENTS

| | | | |
|---|---|---|---|
| 8,407,540 B2 * | 3/2013 | Chandra | G01B 31/318357 327/202 |
| 2004/0090256 A1 * | 5/2004 | Cho | H03K 3/356008 327/202 |
| 2006/0220717 A1 | 10/2006 | Padhye et al. | |
| 2007/0085585 A1 | 4/2007 | Frederick | |
| 2008/0056049 A1 | 3/2008 | Moyer et al. | |
| 2009/0058484 A1 | 3/2009 | Rao et al. | |
| 2009/0066385 A1 | 3/2009 | Hoover | |
| 2010/0001774 A1 * | 1/2010 | Djaja | H03K 3/012 327/202 |
| 2016/0065188 A1 | 3/2016 | Singhal | |
| 2017/0012611 A1 * | 1/2017 | Escobar | H03K 3/0372 |
| 2018/0083603 A1 * | 3/2018 | Urard | H03K 19/0002 |

* cited by examiner

METHOD FOR MANAGING THE OPERATION OF A SYNCHRONOUS RETENTION FLIP-FLOP CIRCUIT EXHIBITING AN ULTRA-LOW LEAKAGE CURRENT, AND CORRESPONDING CIRCUIT

PRIORITY CLAIM

This application claims the priority benefit of French Application for Patent No. 1658753, filed on Sep. 19, 2016, the disclosure of which is hereby incorporated by reference in its entirety.

TECHNICAL FIELD

Implementations and embodiments relate to sequential logic circuits and more particularly to synchronous retention flip-flop circuits (i.e., circuits configured to be capable of preserving, when power is cut to most of said synchronous retention flip-flop circuits, stored data using a small portion of said circuits which are powered permanently).

BACKGROUND

In particular because in integrated circuits transistor size continues to decrease under the 100 nm bar by virtue of the advance of technologies such as the CMOS SOI technology, the power consumption associated with static leakage currents is becoming increasingly significant with respect to overall integrated-circuit consumption.

A plurality of techniques, such as power source switching and the use of transistors having a plurality of threshold voltages, commonly referred to as multi-threshold CMOS (MTCMOS) transistors in the art, have been adopted to decrease the consumption associated with static leakage currents.

Nevertheless, these techniques cannot preserve data, for example during an integrated-circuit power-source interruption.

Under these circumstances, synchronous data-retention flip-flop circuits are generally used in order not only to decrease the consumption due to static leakage currents, but also to prevent the loss of stored data.

However, the use of synchronous data-retention flip-flop circuits generally requires many control signals and a non-negligible area of silicon.

There is accordingly a need in the art to provide a low-complexity technical solution employing a small area of silicon to decrease the consumption due to leakage currents from a synchronous data-retention flip-flop circuit.

SUMMARY

According to one aspect, a method is provided for managing the operation of a synchronous retention flip-flop circuit comprising a first circuit module suitable for being powered by an interruptible power source (i.e., a power source that is suitable for being interrupted) and a second circuit module suitable for being powered by a permanent power source.

The method comprises: storing at least one datum in the first circuit module while the interruptible power source is supplying power, the storage being controlled by a first control signal and an internal clock signal; delivering said at least one datum to the second circuit module before an interruption of the interruptible power source, said delivery being controlled by a second control signal; retaining said at least one datum in the second circuit module during the interruption, said retention being controlled by the second control signal; and restoring said at least one datum to the first circuit module at the end of the interruption, said restoration being controlled by the first control signal.

Advantageously, only the second control signal remains active during the interruption of the interruptible power source.

Such a use of a single active control signal, here the second control signal, during the retention of said at least one datum allows the number of control signals used during the restoration, as well as the used area of silicon for the circuitry, to be decreased. Therefore, the consumption due to leakage current is reduced by virtue of this decrease.

According to another aspect, a synchronous retention flip-flop circuit is provided comprising a first circuit module suitable for being powered by an interruptible power source and a second circuit module suitable for being powered by a permanent power source.

The first circuit module includes: a first control circuit configured to deliver a first control signal; a clock stage configured to generate an internal clock signal; a first latch stage suitable for being controlled by the internal clock signal and a second latch stage suitable for being controlled by the first control signal and the internal clock signal, which are configured to store at least one datum while said interruptible power source is supplying power; a transmit circuit suitable for being controlled by a second control signal and configured to deliver said at least one datum to the second circuit module before an interruption of said interruptible power source, the second circuit module being configured to preserve said at least one datum during said interruption; and a restoring circuit suitable for being controlled by the first control signal and configured to restore said at least one datum.

The second circuit module includes a second control circuit configured to deliver the second control signal.

Only the second control signal remains active during the interruption of the interruptible power source.

According to one embodiment, the first circuit module includes a first transmission circuit suitable for being controlled by the internal clock signal and coupling the second latch stage to the first latch stage; the transmit circuit include a second transmission circuit suitable for being controlled by the second control signal and coupled between the second latch stage and the second circuit module; and the restoring circuit include a third transmission circuit suitable for being controlled by the first control signal, coupled between the second latch stage and the second circuit module.

According to another embodiment, the first transmission circuit, which is suitable for being controlled by the internal clock signal, is configured to be in an on state only when the internal clock signal possesses a first value, and the second latch stage, which is suitable for being controlled by the internal clock signal, is configured to store said at least one datum only when the internal clock signal possesses a second value that is complementary to the first value.

By way of non-limiting example, the first latch stage may include a first tri-state inverter suitable for being controlled by the internal clock signal. The second latch stage may include a second tri-state inverter suitable for being controlled by the first control signal. The second transmission circuit may include a third tri-state inverter suitable for being controlled by the second control signal. The third transmission circuit may include a fourth tri-state inverter suitable for being controlled by the first control signal.

According to yet another embodiment, the second circuit module includes a third latch stage coupled to the first circuit module, suitable for being controlled by the second control signal and configured to preserve said at least one datum.

The third latch stage may for example include a fifth tri-state inverter suitable for being controlled by the second control signal.

Advantageously, the second circuit module and the second transmission circuit may include transistors of ultra-high threshold voltage.

The use of such transistors allows the static leakage current of the second circuit module suitable for being powered by the permanent power source to be further decreased so as to decrease the overall power consumption of said synchronous retention flip-flop circuit, especially during the interruption of the interruptible power source.

According to another aspect, a system is provided including at least one circuit such as defined above.

According to yet another aspect, an electronic apparatus, such as a mobile cell phone, tablet, or laptop computer, comprising at least one system such as defined above is provided.

BRIEF DESCRIPTION OF THE DRAWINGS

Other advantages and features of the invention will become apparent on examining the detailed description of wholly non-limiting implementations and embodiments and the appended drawings in which.

DETAILED DESCRIPTION

Figure 1:
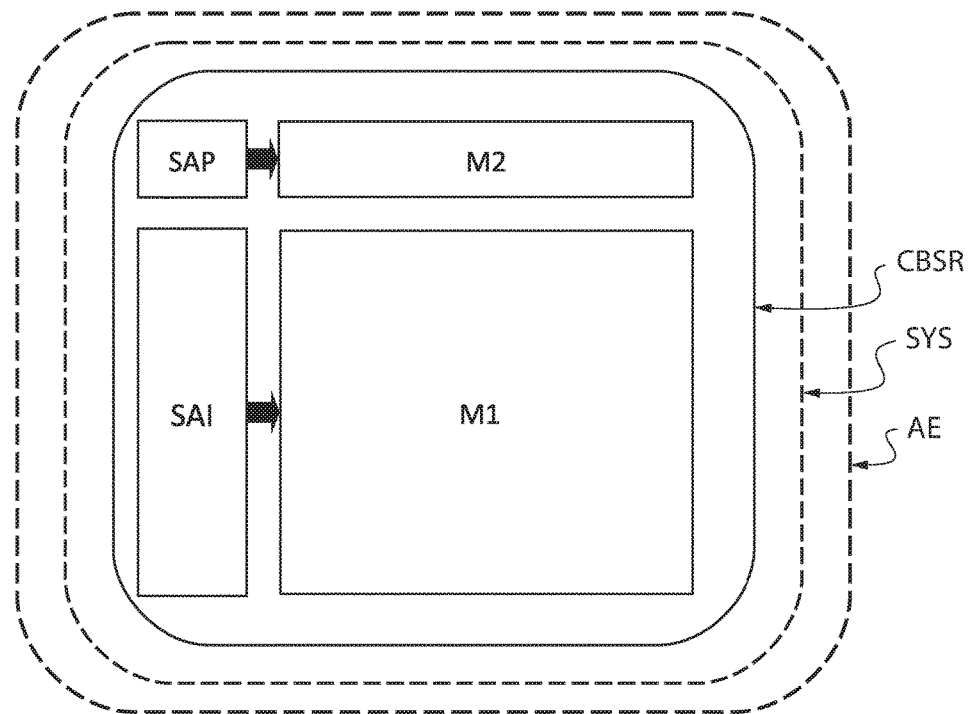
FIG. 1 schematically illustrates an electronic apparatus comprising a processing system with shift registers including a synchronous flip-flop circuit.

FIG. 1 very schematically illustrates an electronic apparatus AE, for example a mobile cell phone, comprising a processing system SYS, here for example a system of shift registers, itself including a synchronous flip-flop circuit such as, for example, what is called a synchronous retention flip-flop circuit CBSR.

The synchronous retention flip-flop circuit CBSR comprises a first circuit module M1 powered by an interruptible power source SAI, i.e. a power source that is able to be interrupted, and a second circuit module M2 powered by a permanent power source SAP.

The synchronous flip-flop circuit CBSR is configured to:
store in the first circuit module M1 of the circuit CBSR at least one datum that it is desired to be preserved;
transfer said at least one datum to the second circuit module M2 of the circuit CBSR prior to an interruption of the interruptible power source SAI so as to decrease the overall consumption of the circuit CBSR;
preserve said at least one datum in the second circuit module M2 during said interruption; and
restore said datum to the first circuit module M1 at the end of the interruption of the interruptible power source SAI or, in other words, during the recovery of the interruptible power source SAI.

Figure 2:
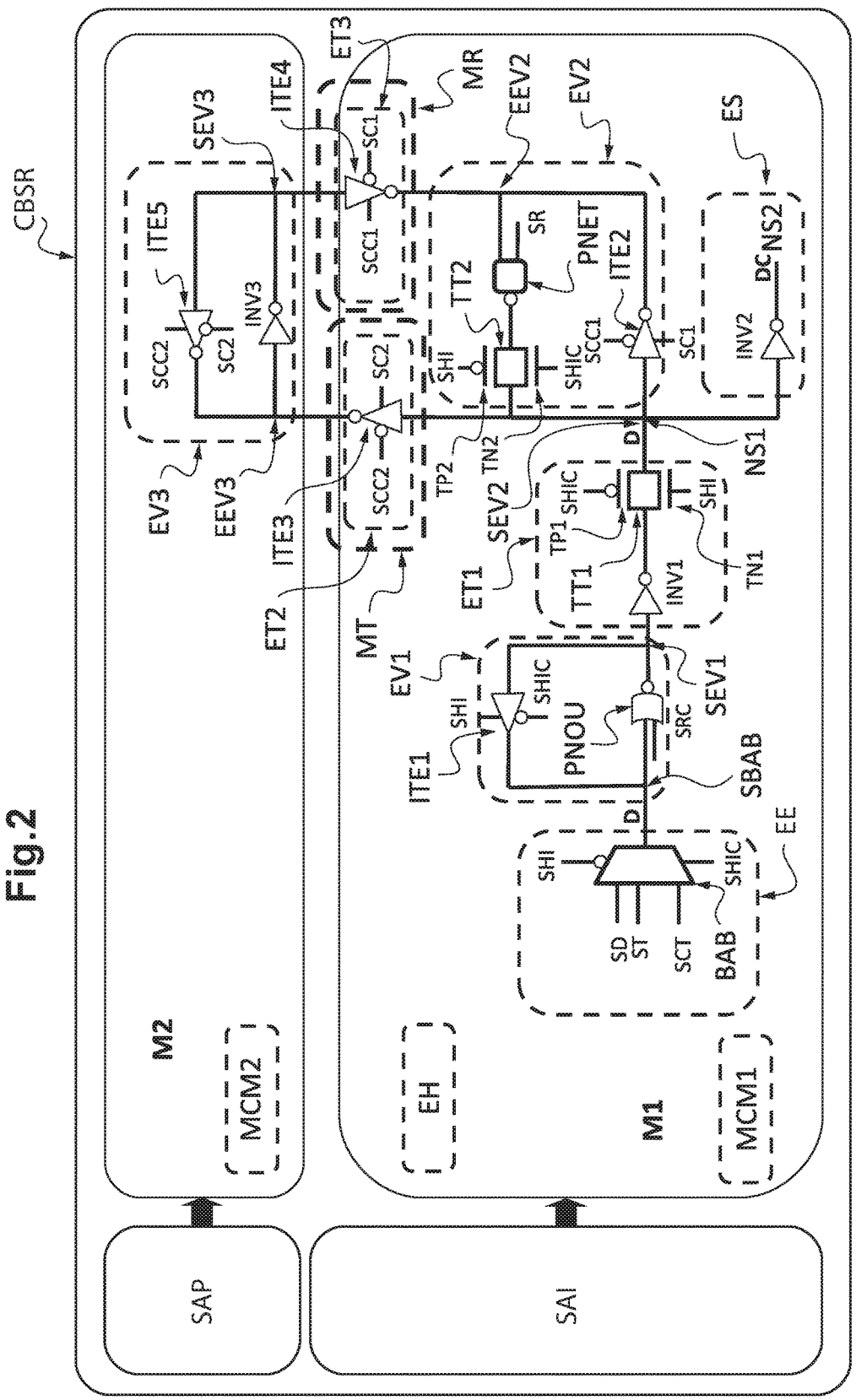
FIG. 2 illustrates an exemplary structure of a synchronous flip-flop circuit.

Reference will now be made to FIG. 2 to illustrate in more detail an exemplary structure of a synchronous flip-flop circuit CBSR according to the invention. For the sake of simplicity, the illustrated example is a synchronous retention flip-flop circuit for retaining 1 bit.

The first circuit module M1 is mainly suitable for being controlled by a first control signal SC1 powered by the interruptible power source SAI and a second control signal SC2 powered by the permanent power source SAP.

The first circuit module M1 includes a clock stage configured to deliver an internal clock signal SHI and a complementary internal clock signal SHIC, and an input stage EE here for example including a synchronous scan flip-flop (BAB) intended to receive on its three inputs: a datum signal SD; a test signal ST; and a test control signal SCT.

The synchronous scan flip-flop BAB is clocked by the internal clock signal SHI and the complementary internal clock signal SHIC.

When the internal clock signal SHI is in its low state, the synchronous scan flip-flop BAB delivers to its output SBAB the datum signal SD or the test signal ST depending on the value of the test control signal SCT. If the test control signal SCT is in its high state, the test signal ST is selected. Otherwise, the datum signal will be delivered to the output SBAB of the synchronous scan flip-flop BAB.

When the internal clock signal SHI is in its high state, no signal is delivered by the synchronous scan flip-flop BAB.

The first circuit module M1 also includes a first latch stage EV1 and a first transmission circuit ET1, which are coupled in series between the input stage EE and a first output node NS1 of the first circuit module M1.

The first latch stage EV1 comprises a first latch including a NOR logic gate PNOU and a first tri-state inverter ITE1 coupled back to back between the output SBAB of the synchronous scan flip-flop and the output SEV1 of the first latch stage.

The NOR logic gate PNOU includes a first input coupled to the output SBAB of the synchronous scan flip-flop BAB, a second input coupled to a complementary reset signal SRC and an output coupled to the output SEV1 of the first latch stage EV1.

The complementary reset signal SRC is generally set to its low state so as to allow the NOR gate PNOU to function as a conventional inverter. When the complementary reset signal SRC is set to its high state, the first latch stage EV1 delivers to its output SEV1 a low logic value ("0").

The first tri-state inverter ITE1 is suitable for being controlled by the internal clock signal SHI and the complementary internal clock signal SHIC and functions as a conventional inverter when the internal clock signal SHI is in its high state and the complementary internal clock signal SHIC is in its low state. Otherwise, the first tri-state inverter ITE1 is in its high-impedance state.

In other words, if the complementary reset signal SRC is in its low state, the first latch stage EV1 functions as a conventional latch when the internal clock signal SHI is in its high state and the complementary internal clock signal SHIC is in its low state. Otherwise, the first latch stage EV1 functions as a conventional inverter.

If the complementary reset signal SRC is in its high state, a low logic value ("0") is delivered to the output SEV1 of the first latch stage EV1 whatever the state of the internal clock signal SHI and the complementary internal clock signal SHIC.

The first transmission circuit ET1 includes a first inverter INV1 and a first pair of transmission transistors TT1 which are coupled in series between the output SEV1 of the first latch stage EV1 and the first output node NS1 of the first circuit module M1.

The first pair of transmission transistors TT1 includes a first pMOS transistor TP1 and a first nMOS transistor TN1 which are coupled in parallel and suitable for being controlled by the complementary internal clock signal SHIC and the internal clock signal SHI, respectively.

The first pair of transmission transistors TT1 is turned on only when the internal clock signal SHI is in its high state and the complementary internal clock signal SHIC is in its low state.

Thus, the first transmission circuit ET1 transmits to the first output mode NS1 a datum D of the datum signal SD or of the test signal ST, which datum is stored in the first latch stage EV1 only when the internal clock signal SHI is in its high state and the complementary internal clock signal SHIC is in its low state.

The first circuit module M1 also comprises a second latch stage EV2 the output of which SEV2 is coupled to the first output node NS1. This second latch stage EV2 includes a second tri-state inverter ITE2 that is coupled between the first output node NS1 and the input EEV2 of the second latch stage EV2, and a second pair of transmission transistors TT2 and a NAND logic gate PNET, which are coupled in series between the first output node NS1 and the input EEV2 of the second latch stage EV2.

The second tri-state inverter ITE2 is suitable for being controlled by a first control signal SC1 and a first complementary control signal SCC1 and functions as a conventional inverter when the first control signal SC1 is in its high state and the first complementary control signal SCC1 is in its low state.

The NAND logic gate PNET includes a first input coupled to the input EEV2 of the second latch stage EV2, a second input coupled to a reset signal SR, and an output coupled to the second pair of transmission transistors TT2.

The reset signal SR has a complemented value with respect to that of the complementary reset signal SRC.

The reset signal SR is generally in its high state so as to allow the NAND gate PNET to function as a conventional inverter. When the reset signal SR is set to its low state, the NAND gate PNET delivers to its output a high logic value ("1").

The second pair of transmission transistors TT2 includes a second pMOS transistor TP2 and a second nMOS transistor TN2, which are coupled in parallel and suitable for being controlled by the internal clock signal SHI and the complementary internal clock signal SHIC, respectively.

The second pair of transmission transistors TT2 is turned on only when the internal clock signal SHI is in its low state and the complementary internal clock signal SHIC is in its high state. The value of the internal clock signal SHI is here complementary to that used for the first transmission circuit ET1 when this first stage is in its on state.

Therefore, if the first control signal SC1 and the reset signal SR are in the high state, the first and second latch stages EV1 and EV2 alternately and successively update, via the first output node NS1, the datum D stored in the first and second latch stages EV1 and EV2, i.e. the datum D of the datum signal SD or of the test signal ST.

The first circuit module M1 also comprises an output stage ES coupled between the first output node NS1 and a second output node NS2. This output stage ES includes a second inverter INV2 intended to deliver a complemented value of the data stored in the first and second latch stages EV1 and EV2.

The first circuit module M1 further comprises transmitting circuit MT including a second transmission circuit ET2 that is coupled to the output SEV2 of the second latch stage EV2 and restoring circuit MR including a third transmission circuit ET3 that is coupled to the input EEV2 of the second latch stage EV2.

The second transmission circuit ET2 includes a third tri-state inverter ITE3 the input of which is coupled to the first output node NS1 and the output of which is coupled to the second circuit module M2.

The second transmission circuit ET2 is suitable for being controlled by a second control signal SC2 and a second complementary control signal SCC2, and functions as a conventional inverter when the second control signal SC2 is in the high state and the second complementary control signal SCC2 is in the low state.

The third transmission circuit ET3 includes a fourth tri-state inverter ITE4 the input of which is coupled to the second circuit module M2 and the output of which is coupled to the input EEV2 of the second latch stage EV2.

The third transmission circuit ET3 is suitable for being controlled by the first control signal SC1 and the first complementary control signal SCC1, and functions as a conventional inverter when the first control signal SC1 is in the low state and the first complementary control signal SCC1 is in the high state.

The second circuit module M2 includes a third latch stage EV3 the input EEV3 of which is coupled to the output of the second transmission circuit ET2 and the output SEV3 of which is coupled to the input of the third transmission circuit ET3.

The third latch stage EV3 includes a third inverter INV3 and a fifth tri-state inverter ITE5 that are coupled back to back between the input EEV3 and the output SEV3 of the third latch stage EV3.

The fifth tri-state inverter ITE5 is suitable for being controlled by the second control signal SC2 and the second complementary control signal SCC2, and functions as a conventional inverter when the second control signal SC2 is in the low state and the second complementary control signal SCC2 is in the high state.

It should be noted that only the second control signal SC2 and the second circuit module M2 are powered by the permanent power source SAP. All the other signals and the first circuit module M1 are powered by the interruptible power source SAI.

Moreover, the second circuit module M2 and the second transmission circuit ET2 include transistors of ultra-high threshold voltage so as to obtain very low leakage currents especially during an interruption of the interruptible power source.

A transistor of ultra-high threshold voltage generally has a high doping density in the substrate/channel region so as to obtain an ultra-low leakage current when this transistor is in the off state. The threshold voltage of such a transistor may vary depending on the technology used; for example, in a 40 nm technology, the threshold voltage of such a transistor may vary between 0.4 and 0.5 V.

Apart from the circuitry just described, the first and second circuit modules M1 and M2 respectively include controlling circuits MCM1 and MCM2, for example based on logic circuits, configured to deliver the first control signal SC1 and the second control signal SC2, respectively.

Figure 3:
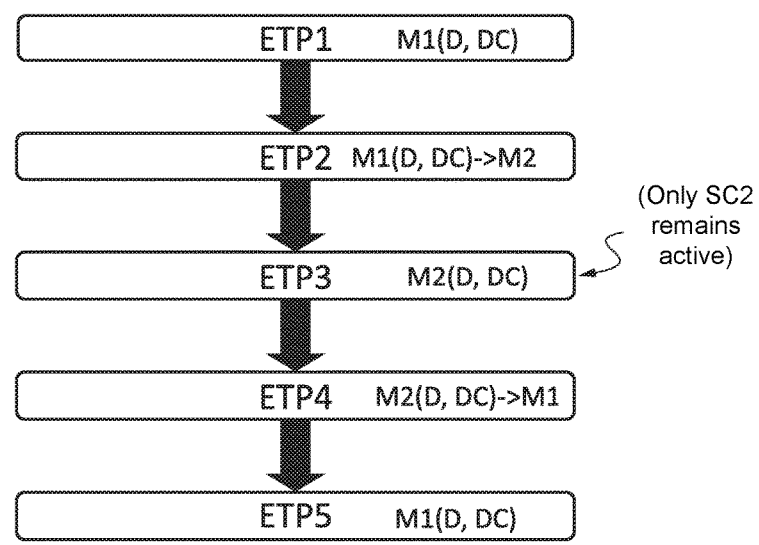
FIG. 3 shows a method for managing the operation of a synchronous flip-flop circuit.

An example of a method for managing the operation of a synchronous flip-flop circuit such as defined above will now be schematically described with reference to FIG. 3.

By default, the reset signal SR is in the high state and the internal clock signal SHI switches periodically between the high state and the low state.

In a first step ETP1, the first circuit module M1 stores a datum D to be preserved, for example a datum of the datum signal SD or of the test signal ST, by setting the first and second control signals SC1 and SC2 to the high and low states, respectively.

Thus, the first and second latch stages EV1 and EV2 function alternately and successively depending on the internal clock signal SHI so as to store the datum D at the first output node NS1. The complemented datum DC is then obtained at the second output node NS2 and at the input EEV2 of the second latch stage EV2.

It should be noted that the second circuit module M2 is isolated from the second latch stage EV2 by the second and third transmission circuits ET2 and ET3 because the third and fourth tri-state inverters ITE3 and ITE4 are in the high-impedance state.

In a second step ETP2 prior to an interruption of the interruptible power source SAI, the second control signal SC2 is set to the high state so as to set the third tri-state inverter ITE3 to the conventional inverter state.

In this case, the first circuit module M1 transfers the datum D, here the complemented datum DC, to the second circuit module M2.

The second control signal SC2 is again set to the low state after the transfer of the datum D. Therefore, the third tri-state inverter ITE3 returns to the high-impedance state and the fifth tri-state inverter ITS functions as a conventional inverter. The third latch stage EV3 is therefore turned on so as to preserve the datum D stored by the first and second latch stages EV1 and EV2.

In a third step ETP3, the interruptible power source SAI powering the first circuit module M1 is deactivated for example at the end of the transfer of the datum to the second circuit module M2. Therefore, only the second circuit module M2 and the second control signal SC2 remain active during this interruption of the interruptible power source SAI.

In a fourth step ETP4 (retaining phase), the second control signal SC2 is maintained in the low state during the interruption of the interruptible power source SAI so as to preserve the datum D in the second circuit module M2.

As the first circuit module M1 includes most of the transistors of the synchronous flip-flop circuit CBSR, the power consumption of the circuit CBSR during the interruption is largely decreased.

In a fifth step ETP5, the first control signal SC1 is set to the low state at the end of the interruption of the interruptible power source SAI so as to transfer the datum D back to the first circuit module M1, via the fourth tri-state inverter ITE4.

Therefore, the first circuit module M1 again receives the datum D which was conserved by the second circuit module M2 during the interruption. In order to make the first latch stage EV1 operational once more and to again isolate the first and second circuit modules M1 and M2, the first control signal SC1 is again set to the high state and the second control signal SC2 is maintained in the low state at the end of the transfer of the datum to the first circuit module M1.

Thus, a synchronous retention flip-flop circuit capable of using a single control signal powered permanently during the retaining phase is obtained, thereby advantageously allowing the consumption of said circuit and the area of silicon used to be significantly decreased.

It should also be noted that the use of a single active control signal during the retaining phase is also compatible with a synchronous flip-flop structure such as that described in co-pending U.S. patent application Ser. No. 15/460,520 filed Mar. 16, 2017 entitled "Method for Managing the Operation of a Low-Complexity Synchronous Retention Flip-Flop Circuit, and Corresponding Circuit" (which claims priority from French Application for Patent No. 1658755 filed Sep. 9, 2016, incorporated herein by reference).

The invention claimed is:

1. A synchronous retention flip-flop circuit, comprising:
a first circuit module configured to be powered by an interruptible power source; and
a second circuit module configured to be powered by a permanent power source;
wherein the first circuit module comprises:
a first controlling circuit configured to deliver a first control signal;
a clock stage configured to generate an internal clock signal;
a first latch stage controlled by the internal clock signal and a second latch stage controlled by the first control signal and the internal clock signal, said first and second latch stages configured to store at least one datum while said interruptible power source is supplying power;
a first transmission circuit controlled by the internal clock signal and configured to couple the second latch stage to the first latch stage;
a transmitting circuit controlled by a second control signal different from the first control signal and configured to deliver said at least one datum to the second circuit module before an interruption of power from said interruptible power source, wherein the transmitting circuit includes a second transmission circuit controlled by the second control signal and coupled between an output of the second latch stage and the second circuit module; and
a restoring circuit controlled by the first control signal and configured to restore said at least one datum in the first and second latch stages at the end of said interruption, wherein the restoring circuit includes a third transmission circuit controlled by the first control signal and coupled between the second circuit module and an input of the second latch stage;
wherein the second circuit module includes a second controlling circuit configured to deliver the second control signal and a latch circuit configured to preserve said at least one datum during said interruption of power from said interruptible power source;
wherein the second control signal is powered by the permanent power source and the first control signal is powered by the interruptible power source; and
wherein the first latch stage includes a first tri-state inverter controlled by the internal clock signal, wherein the second latch stage includes a second tri-state inverter controlled by the first control signal, wherein the second transmission circuit includes a third tri-state inverter controlled by the second control signal, and wherein the third transmission circuit includes a fourth tri-state inverter controlled by the first control signal.

2. The circuit according to claim 1, wherein the first transmission circuit controlled by the internal clock signal is configured to be in an on state only when the internal clock signal possesses a first value, and wherein the second latch stage controlled by the internal clock signal is configured to store said at least one datum only when the internal clock signal possesses a second value that is complementary to the first value.

3. The circuit according to claim 1, wherein the latch circuit of the second circuit module is controlled by the second control signal to preserve said at least one datum.

4. The circuit according to claim 3, wherein the latch circuit includes a fifth tri-state inverter controlled by the second control signal.

5. The circuit according to claim 1, wherein the second circuit module and the second transmission circuit include transistors of ultra-high threshold voltage.

6. An electronic apparatus including a circuit according to claim 1.

7. The electronic apparatus according to claim 6, wherein the electronic apparatus is a device selected from a group consisting of: a mobile cell phone, a tablet, and a laptop computer.

8. A synchronous retention flip-flop circuit, comprising:
a first circuit module configured to be powered by an interruptible power source; and
a second circuit module configured to be powered by a permanent power source;
wherein the first circuit module comprises:
a first controlling circuit configured to deliver a first control signal;
a clock stage configured to generate an internal clock signal;
a first latch stage controlled by the internal clock signal and a second latch stage controlled by the first control signal and the internal clock signal, said first and second latch stages configured to store at least one datum while said interruptible power source is supplying power;
a transmitting circuit controlled by a second control signal different from the first control signal and configured to deliver said at least one datum to the second circuit module before an interruption of power from said interruptible power source; and
a restoring circuit controlled by the first control signal and configured to restore said at least one datum in the first and second latch stages at the end of said interruption;
wherein the second circuit module includes a second controlling circuit configured to deliver the second control signal and a latch circuit configured to preserve said at least one datum during said interruption of power from said interruptible power source; and
wherein the second control signal is powered by the permanent power source and the first control signal is powered by the interruptible power source;
wherein the latch circuit of the second circuit module is controlled by the second control signal to preserve said at least one datum; and
wherein the latch circuit includes a tri-state inverter controlled by the second control signal.

9. The circuit according to claim 8,
wherein the first circuit module includes a first transmission circuit controlled by the internal clock signal and configured to couple the second latch stage to the first latch stage;
wherein the transmitting circuit includes a second transmission circuit controlled by the second control signal and coupled between an output of the second latch stage and the second circuit module; and
wherein the restoring circuit includes a third transmission circuit controlled by the first control signal and coupled between the second circuit module and an input of the second latch stage.

10. The circuit according to claim 9, wherein the first transmission circuit controlled by the internal clock signal is configured to be in an on state only when the internal clock signal possesses a first value, and wherein the second latch stage controlled by the internal clock signal is configured to store said at least one datum only when the internal clock signal possesses a second value that is complementary to the first value.

11. The circuit according to claim 9, wherein the first latch stage includes a first tri-state inverter controlled by the internal clock signal, wherein the second latch stage includes a second tri-state inverter controlled by the first control signal, wherein the second transmission circuit includes a third tri-state inverter controlled by the second control signal, and wherein the third transmission circuit includes a fourth tri-state inverter controlled by the first control signal.

12. The circuit according to claim 9, wherein the second circuit module and the second transmission circuit include transistors of ultra-high threshold voltage.

13. An electronic apparatus including a circuit according to claim 8.

14. The electronic apparatus according to claim 13, wherein the electronic apparatus is a device selected from a group consisting of: a mobile cell phone, a tablet, and a laptop computer.

* * * * *

UNITED STATES PATENT AND TRADEMARK OFFICE
CERTIFICATE OF CORRECTION

PATENT NO. : 10,263,603 B2
APPLICATION NO. : 15/462494
DATED : April 16, 2019
INVENTOR(S) : Pascal Urard et al.

Page 1 of 1

It is certified that error appears in the above-identified patent and that said Letters Patent is hereby corrected as shown below:

In the Specification

At Column 7, Line 27, please replace [[ITS]] with -- IT5 --

Signed and Sealed this
Twenty-fifth Day of February, 2020

Andrei Iancu
*Director of the United States Patent and Trademark Office*